US010101651B1

(12) United States Patent
Wei et al.

(10) Patent No.: US 10,101,651 B1
(45) Date of Patent: Oct. 16, 2018

(54) PHOTO MASK ASSEMBLY AND OPTICAL APPARATUS INCLUDING THE SAME

(71) Applicant: Taiwan Semiconductor Manufacturing Co., Ltd., Hsinchu (TW)

(72) Inventors: SHao-Chi Wei, Hsinchu (TW);
Cheng-Ming Lin, Yunlin County (TW);
Sheng-Chang Hsu, New Taipei (TW);
Yu-Hsin Hsu, Taichung (TW);
Hao-Ming Chang, Pingtung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/486,305

(22) Filed: Apr. 13, 2017

(51) Int. Cl.
*G03B 27/58* (2006.01)
*G03F 1/64* (2012.01)
*G03F 1/22* (2012.01)
*G03F 1/60* (2012.01)
*G03F 7/20* (2006.01)

(52) U.S. Cl.
CPC .............. *G03F 1/64* (2013.01); *G03F 1/22* (2013.01); *G03F 1/60* (2013.01); *G03F 7/7015* (2013.01); *G03F 7/70916* (2013.01)

(58) Field of Classification Search
CPC ....... G03F 7/70916; G03F 1/00; G03F 7/7015
USPC ..................................................... 355/72, 75
See application file for complete search history.

(56) References Cited

U.S. PATENT DOCUMENTS

| 4,131,363 | A | 12/1978 | Shea et al. |
| 9,310,673 | B2 | 4/2016 | Yano et al. |
| 2007/0264582 | A1 | 11/2007 | Chang et al. |
| 2008/0264441 | A1 | 10/2008 | Takagi |
| 2010/0304134 | A1 | 12/2010 | Nakano et al. |
| 2011/0063601 | A1* | 3/2011 | Kim ................ C25D 11/04 355/75 |
| 2016/0147141 | A1* | 5/2016 | Ono .................. G03F 1/24 430/5 |
| 2017/0068157 | A1* | 3/2017 | Park ................. G03F 1/64 |

OTHER PUBLICATIONS

Akiyama et al., "Realization of EUV Pellicle With Single Crystal Silicon Membrane", 2009 International EUVL Symposium Prague, Czech, 2009, pp. 1-16.
Syed Rizvl., "Handbook of photomask manufacturing technology", by CRC Press, ISBN 9780824753740, Apr. 7, 2005, pp. 1-2.
Chun-Hsiang Yang., "The study on protective film of composition and performance of anti-static coatings and pressure sensitive adhesive for TAC", National Taiwan University of Science and Technology, Department of Polymer Engineering, Master thesis, Jul. 2009, pp. 1-112.

\* cited by examiner

*Primary Examiner* — Hung Henry Nguyen
(74) *Attorney, Agent, or Firm* — JCIPRNET (57) ABSTRACT

A photo mask assembly including a photo mask, a first adhesive layer adhered with the photo mask, a pellicle frame and a pellicle is provided. The pellicle frame includes a plurality of recesses for accommodating the first adhesive layer. The pellicle frame is adhered with the photo mask through the first adhesive layer accommodated in the plurality of recesses. The pellicle is disposed on the pellicle frame. The pellicle frame is between the pellicle and the first adhesive layer. An optical apparatus including the above-mentioned photo mask assembly is also provided.

20 Claims, 5 Drawing Sheets

PHOTO MASK ASSEMBLY AND OPTICAL APPARATUS INCLUDING THE SAME

BACKGROUND

Pellicle and pellicle frame mounted on the photo mask by adhesive are now widely utilized in photo mask manufacturing house for defects control of its production. When the photo mask mounted with the pellicle is contaminated by particles or is exposed for a long period, the pellicle needs to be replaced by a new one. Cleaning and inspection processes follow subsequently after the pellicle were removed by the pellicle cutter and de-mounting machine in order to make sure the eradication of not only the contamination but also the adhesive. Due to the degradation and outgassing of the adhesive, the adhesive becomes denser and is hard to remove. When the adhesive is not removed completely, the adhesive residue results in killing defects and then spreads around the pattern or even damages the pattern on the photo mask. The removal of such killing defects takes a lot of time and cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
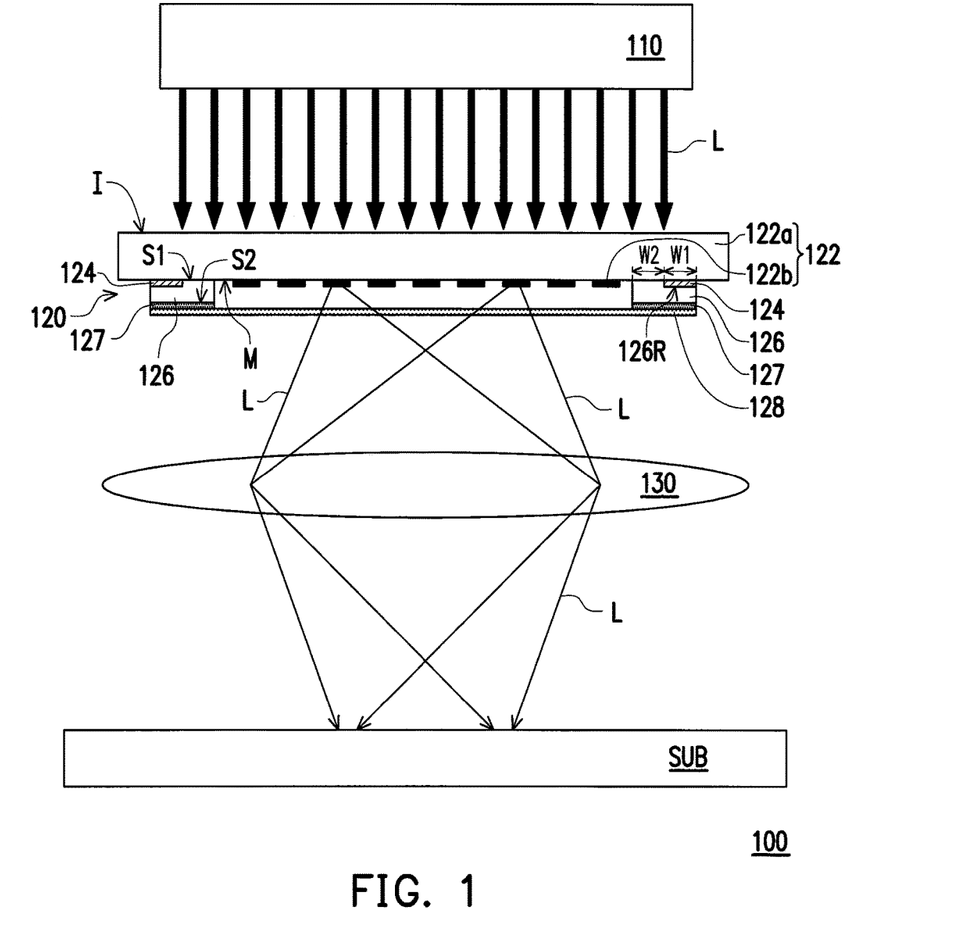
FIG. 1 is a cross-sectional view illustrating an optical apparatus in accordance with some embodiments.

FIG. 1 is a cross-sectional view illustrating an optical apparatus in accordance with some embodiments. Referring to FIG. 1, the optical apparatus 100 is utilized to perform photolithography process on a substrate SUB. In some embodiments, the substrate SUB is a wafer having a photoresist layer formed thereon. In some alternative embodiments, the substrate SUB is a circuit board having a photoresist layer formed thereon. The optical apparatus 100 for performing photolithography process on the substrate SUB may include a light source 110, a photo mask assembly 120 and a projection lens 130. The photo mask assembly 120 is disposed between the light source 110 and the substrate SUB. The projection lens 130 is disposed between the photo mask assembly 120 and the substrate SUB.

In some embodiments, the light source 110 of the optical apparatus 100 is capable of providing light beam L and the wavelength of the light beam L provided by the light source 110 of the optical apparatus 100 may range from about 10 nm to about 365 nm. For example, the wavelength of the light beam L provided by the light source 110 of the optical apparatus 100 is about 13.5 nm. In other words, the light provided by the light source 110 of the optical apparatus 100 is extreme ultraviolet (EUV) light. In some alternative embodiments, the wavelength of the light beam L provided by the light source 110 of the optical apparatus 100 is about 193 nm, 248 nm or 365 nm. The wavelength of the light beam L is not limited in this disclosure. The light beam L emitted from the light source 110 passes through the photo mask assembly 120 and the projection lens 130 in sequence and irradiates onto the photoresist layer formed on the substrate SUB. The projection lens 130 may have predetermined magnification to project the patterning onto the photoresist layer on the substrate SUB; however, the magnification of the projection lens 130 is not limited.

The photo mask assembly 120 includes a photo mask 122, a first adhesive layer 124, a pellicle frame 126 and a pellicle 128. The first adhesive layer 124 is adhered with the photo mask 122. The pellicle 128 is disposed on the pellicle frame 126. The pellicle frame 126 includes a plurality of recesses 126R for accommodating the first adhesive layer 124. The pellicle frame 126 is adhered with the photo mask 122 through the first adhesive layer 124 that is accommodated in the plurality of recesses 126R. The pellicle frame 126 is disposed between the pellicle 128 and the first adhesive layer 124.

As shown in FIG. 1, the photo mask assembly 120, the projection lens 130 and the substrate SUB are disposed on the propagation path of the light beam L (i.e. the optical path of the light beam L) provided by the light source 110. The photo mask assembly 120 is disposed on the propagation path of the light beam L that is between the light source 110 and the substrate SUB. The projection lens 130 is disposed on the propagation path of the light beam L that is between the photo mask assembly 120 and the substrate SUB. The arrangement of the light source 110, the photo mask assembly 120, the projection lens 130 and the substrate SUB shown in FIG. 1 is not limited thereto, other optical components (e.g. reflectors, prisms and so on) may be utilized and the optical path of the optical apparatus 100 may be modified or optimized in accordance with design requirements.

In the photo mask assembly 120 in accordance with some embodiments, the photo mask 122 includes a transparent substrate 122a and a light-shielding pattern 122b disposed on the transparent substrate 122a, and the light-shielding pattern 122b is located between the transparent substrate 122a and the pellicle 128. In some embodiment, the transparent substrate 122a includes glass or quartz substrate with high transmittance and the light-shielding pattern 122b includes a patterned metallic layer. The transparent substrate 122a includes a light-incident surface I and a mounting surface M, wherein the light-incident surface faces the light source 110 and the mounting surface M is opposite to the light-incident surface I. The light-shielding pattern 122b is distributed on the mounting surface M of the transparent substrate 122a. The pellicle frame 126 is mounted onto the mounting surface M of the transparent substrate 122a through the first adhesive layer 124 that is accommodated in the plurality of recesses 126R. Furthermore, the light-shielding pattern 122b formed on the mounting surface M of the transparent substrate 122a is distributed within an area that is surrounded by the pellicle frame 126.

The light beam L emitted from the light source 110 passes through the photo mask assembly 120 and the projection lens 130 in sequence such that the patterning of the light-shielding pattern 122b is transferred or projected onto the photoresist layer formed on the substrate SUB by the projection lens 130.

As shown in FIG. 1, the pellicle frame 126 includes a first surface S1 and a second surface S2 opposite to the first surface S1, wherein the plurality of recesses 126R are formed in the pellicle frame 126 and extend from the first surface S1 toward the second surface S2. The depth of the plurality of recesses 126R is less than the thickness of the pellicle frame 126. In other words, the recesses 126R do not penetrate the pellicle frame 126 and the first adhesive layer 124 in the recesses 126R is thinner than the pellicle frame 126.

The adhesion between the first adhesive layer 124 and the pellicle frame 126 is not only relevant to the contact area of the first adhesive layer 124 and the pellicle frame 126, but also relevant to the adhesion force of the first adhesive layer 124 and the surface roughness of the plurality of recesses 126R. In some embodiments (for FIG. 2 and FIG. 5), in order to obtain sufficient adhesion between the first adhesive layer 124 and the pellicle frame 126, the contact area of the first adhesive layer 124 and the pellicle frame 126 may range from about 0.43 cm$^2$ to about 32.3 cm$^2$, the adhesion force of the first adhesive layer 124 may range from about 30N to about 80N, and/or the surface roughness of the plurality of recesses 126R may range from about 0.08 micrometer to about 1 micrometer. In some alternative embodiments (for FIG. 4 and FIG. 6), in order to obtain sufficient adhesion between the first adhesive layer 124 and the pellicle frame 126, the total volume of the plurality of recesses 126R may range from about 0.000043 cm$^3$ to about 16.15 cm$^3$, the adhesion force of the first adhesive layer 124 may range from about 30N to about 80N, and/or the surface roughness of the plurality of recesses 126R may range from about 0.08 micrometer to about 1 micrometer.

The volume of the first adhesive layer 124 is corresponding to the volume of the plurality of recesses 126R and the thickness of the first adhesive layer 124 is corresponding to the depth of the plurality of recesses 126R. In some embodiments, the maximum thickness of the pellicle frame 126 may range from about 1 millimeter to about 10 millimeters while the thickness of the first adhesive layer 124 (or the depth of the plurality of recesses 126R) may range from about 0.001 millimeter to about 5 millimeters.

The pellicle frame 126 is adhered with the mounting surface M of the photo mask 122 through the first adhesive layer 124 that is accommodated in the plurality of recesses 126R and the first surface S1 of the pellicle frame 126 is in contact with the mounting surface M of the photo mask 122. In addition, there is no adhesive existing between the first surface S1 of the pellicle frame 126 and the mounting surface M of the photo mask 122.

The adhesion between the photo mask 122 and the first adhesive layer 124 is not only relevant to the contact area of the photo mask 122 and the first adhesive layer 124, but also relevant to the adhesion force of the first adhesive layer 124 and the surface roughness of mounting surface M of the photo mask 122. In some embodiments, the contact area of the photo mask 122 and the first adhesive layer 124 may range from about 0.43 cm$^2$ to about 24.1 cm$^2$ and the surface roughness of mounting surface M of the photo mask 122 may range from about 0.08 micrometer to about 1 micrometer.

In some embodiments, the contact area between the pellicle frame 126 and the photo mask 122 is A1 (i.e. the first contact area), the contact area between the first adhesive layer 124 and the photo mask 122 is A2 (i.e. the second contact area), and the ratio of A1 and A2 (i.e. A1/A2) may range from about 0.5 to about 2. In some embodiments, A1 and A2 satisfy the following relation (1) and relation (2):

$$33\% \leq A1/(A1+A2) \leq 67\% \quad (1)$$

$$33\% \leq A2/(A1+A2) \leq 67\% \quad (2)$$

After the photo mask assembly 120 is exposed under the light beam L provided by the light source 110 for a long period, the first adhesive layer 124 may degrade and the thickness of the degraded first adhesive layer 124 is not reduced significantly even though the first adhesive layer 124 are degraded. Since the first surface S1 of the pellicle frame 126 is in contact with the mounting surface M of the transparent substrate 122a, the pellicle frame 126 and the photo mask assembly 120 provide sufficient support to maintain the thickness of the degraded first adhesive layer 124. Accordingly, the degraded first adhesive layer 124 does not deform significantly and does not become denser. Under the condition that the pellicle frame 126 and the pellicle 128 are needed to be replaced, the degraded or aged first adhesive layer 124 is easy to be removed.

As shown in FIG. 1, the photo mask assembly 122 may further include a second adhesive layer 127. The second adhesive layer 127 is disposed between the pellicle 128 and the pellicle frame 126. The pellicle 128 is adhered with the second surface S2 of the pellicle frame 126 through the second adhesive layer 127. In some embodiments, the contact area between the second adhesive layer 127 and the second surface S2 is A0, the contact area between the pellicle frame 126 and the photo mask 122 is A1 (i.e. the first contact area), the contact area between the first adhesive layer 124 and the photo mask 122 is A2 (i.e. the second contact area), and the sum of A1 and A2 is substantially equal to A0. In some embodiments, A0, A1 and A2 satisfy the following relation (3) and relation (4):

$$33\% \leq A1/A0 \leq 67\% \quad (3)$$

$$33\% \leq A2/A0 \leq 67\% \quad (4)$$

Through the second adhesive layer 127, the pellicle 128 is stably supported by the pellicle frame 126 such that a space or a gap is formed between the pellicle 128 and the photo mask assembly 122. The pellicle 128 covers and protects the light-shielding pattern 122b of the photo mask assembly 122 covered thereby. In addition, the pellicle 128 prevents the light-shielding pattern 122b of the photo mask assembly 122 from particle contamination.

After the photo mask assembly 120 is used for a long period, the first adhesive layer 124 may degrade and/or some particles may be found on the light-shielding pattern 122b of the photo mask assembly 120. At this time, it is necessary to replace the pellicle 128 with a new one to prevent killing defects. For example, the replacement process of the pellicle 128 may include: removal of pellicle 128; de-mounting of pellicle frame 126; and removal the residue of the first adhesive layer 124 from the photo mask 122.

In some embodiments, the removal of the pellicle 128 may include: loading the photo mask assembly 120; locking the photo mask assembly 120; pumping down; cutting the pellicle 128 by a pellicle cutter; removing the residue of the pellicle 128; and cleaning the pellicle cutter.

In some embodiments, the de-mounting of pellicle frame 126 performed in a cover may include: heating the pellicle frame 126 and the photo mask 122 to about 150 Celsius degrees, for example; closing the cover; pushing the handing tool down to remove the pellicle frame 126; removing the pellicles frame 126 by pins; loosening the handle tool; checking and cleaning the residue of the first adhesive layer 124 on the pellicles frame 126; and opening the cover.

In some embodiments, the removal the residue of the first adhesive layer 124 from the photo mask 122 performed in cleanroom may include: preparing a cleanroom wiper; dripping cleaning solution (e.g., methanol) on the residue of the first adhesive layer 124; wiping the residue of the first adhesive layer 124 on the photo mask 122; changing a new wiper; dripping de-glue solvent on the residue of the first adhesive layer 124; wiping the residue of the first adhesive layer 124 on the photo mask 122 again; and unloading the photo mask 122. In some alternative embodiments, the removal steps may be repeated at least one time so as to make sure that the residue of the first adhesive layer 124 on the photo mask 122 are removed.

Since the distribution of the first adhesive layer 124 is confined within the recesses 126R of the pellicle frame 126, the first adhesive layer 124 sandwiched between the pellicle frame 126 and the photo mask 122 is not squeezed and becomes denser; accordingly, it is easy to remove the residue of the first adhesive layer 124 on the photo mask 122 even though the first adhesive layer 124 are degraded. In addition, because it is easy to remove the residue of the first adhesive layer 124, the damage risk of the photo mask 122 during the replacement process of the pellicle 128 may be reduced.

In some embodiments, the material of the first adhesive layer 124 may be blending silane compounds. In some alternative embodiments, the material of the first adhesive layer 124 may be adhesive materials without containing acid ingredient (e.g., acetic acid). In another embodiment, the material of the first adhesive layer 124 may be adhesive materials containing reduced amount of catalyst and/or initiator.

Figure 2:
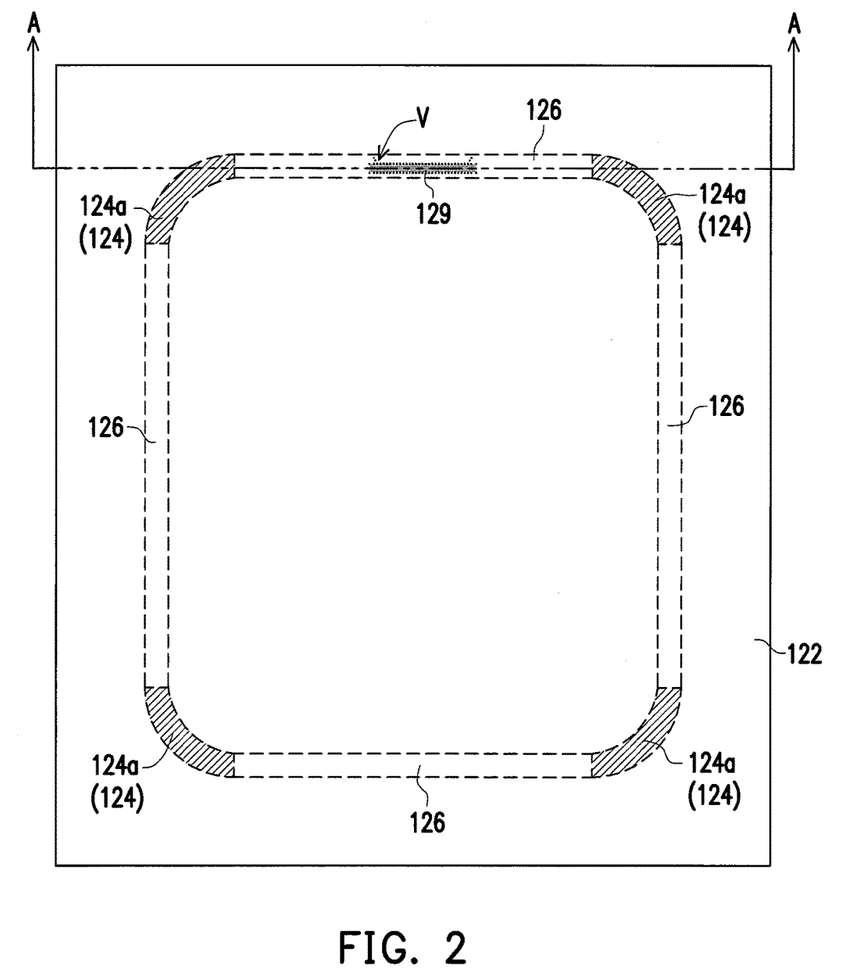
FIG. 2 is a top view illustrating the pellicle frame and the photo mask of the photo mask assembly in accordance with some embodiments.
Figure 3:
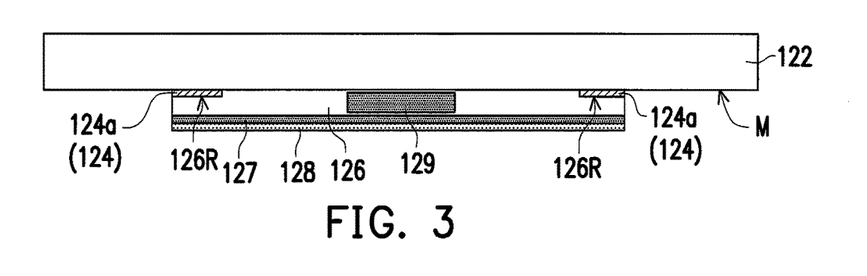
FIG. 3 is a cross-sectional view of the photo mask assembly along the cross-sectional line A-A in accordance with some embodiments.

FIG. 2 is a top view illustrating the pellicle frame and the photo mask of the photo mask assembly in accordance with some embodiments and FIG. 3 is a cross-sectional view of the photo mask assembly along the cross-sectional line A-A in accordance with some embodiments. Referring to FIG. 2 and FIG. 3, the first adhesive layer 124 includes a plurality of adhesive portions 124a adhered with the mounting surface M of the photo mask 122 and each of the adhesive portions 124a is accommodated in one of the recesses 126R respectively.

The space or gap between the pellicle 128 and the photo mask assembly 122 may communicate with the environment via a vent hole V. In order to prevent the light-shielding pattern 122b (shown in FIG. 1) of the photo mask assembly 122 from particle contamination, the photo mask assembly further includes a filter 129 (shown in FIG. 3). The filter 129 is embedded in the pellicle frame 126 to block particles from entering the space or gap between the pellicle 128 and the photo mask assembly 122.

As shown in FIG. 2, the first adhesive layer 124 includes four adhesive portions 124a and the distribution of the adhesive portions 124a is corresponding to the corners of the pellicle frame 126. In addition, the width of the first adhesive layer 124 is substantially equal to the maximum width of the pellicle frame 126 and the first adhesive layer 124 (i.e. the adhesive portion 124a) is thinner than the pellicle frame 126.

Figure 4:
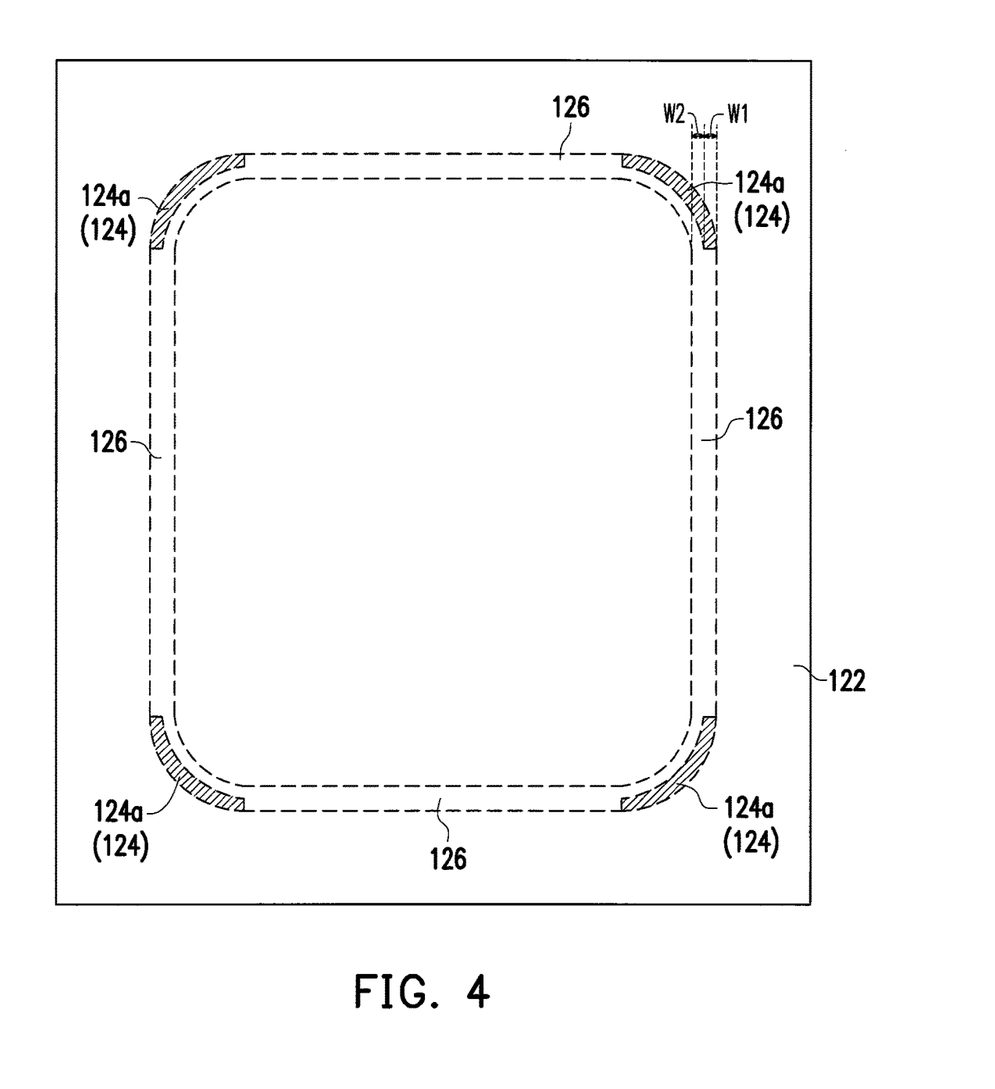
FIG. 4 through FIG. 6 are top views illustrating the pellicle frame and the photo mask of the photo mask assembly in accordance with some alternative embodiments.
Figure 5:
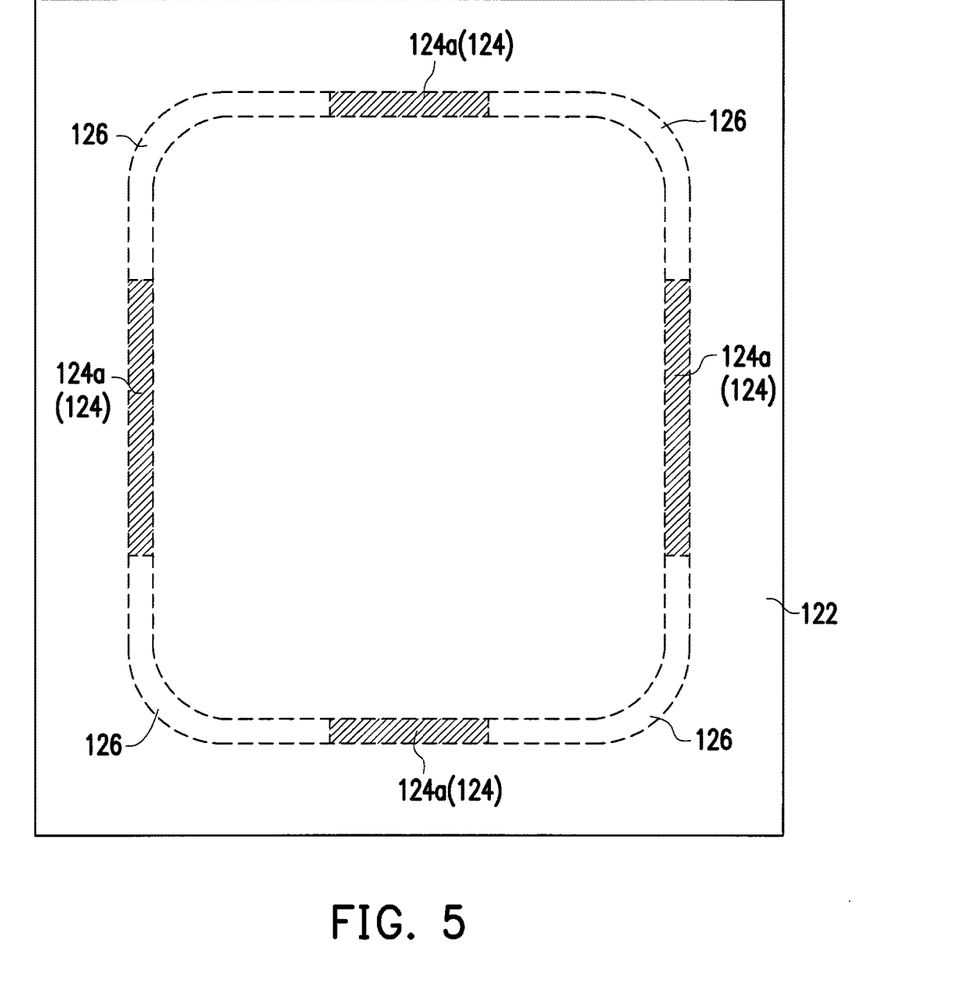
Figure 6:
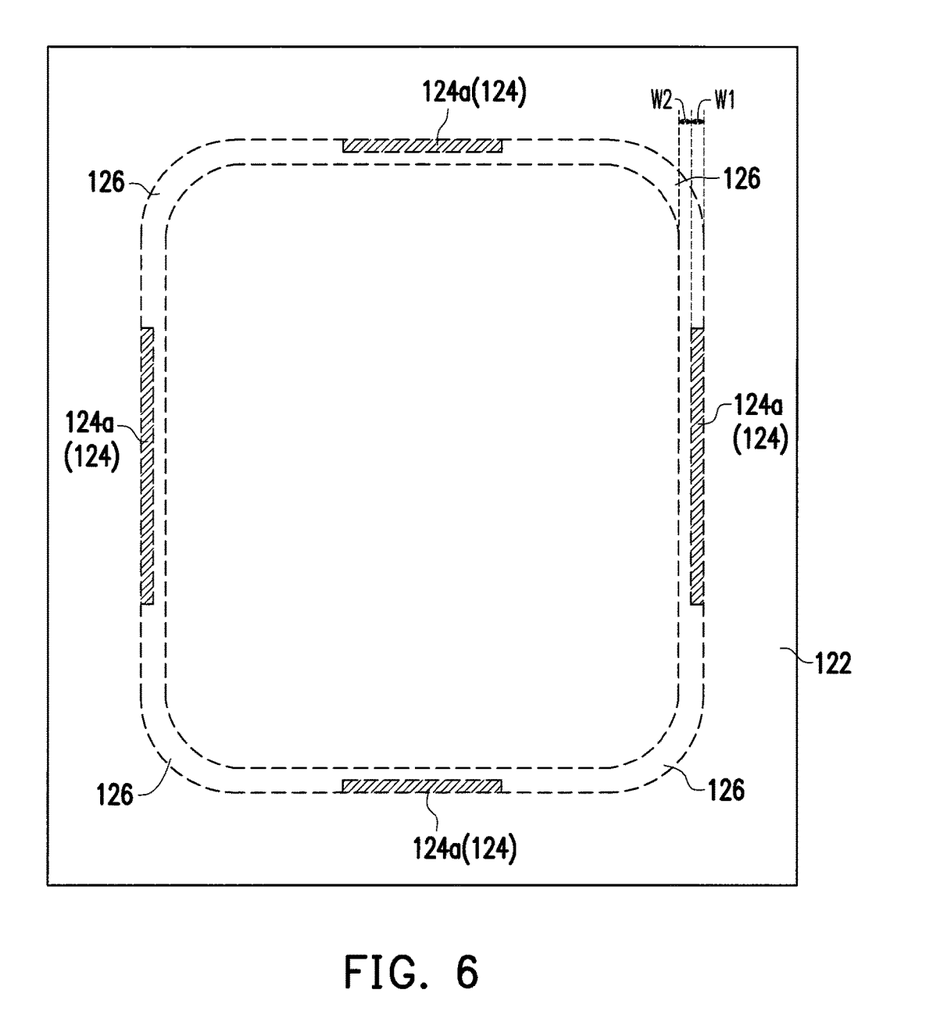

FIG. 4 through FIG. 6 are top views illustrating the pellicle frame and the photo mask of the photo mask assembly in accordance with some alternative embodiments.

Referring to FIG. 4, the first adhesive layer 124 includes four adhesive portions 124a and the distribution of the adhesive portions 124a is corresponding to the corners of the pellicle frame 126. In addition, the width of the first adhesive layer 124 is less than the maximum width of the pellicle frame 126 and the first adhesive layer 124 (i.e. the adhesive portion 124a) is thinner than the pellicle frame 126.

As shown in FIG. 1 and FIG. 4, the width of the first adhesive layer 124 is W1 and the maximum width of the pellicle frame 126 is (W1+W2), and the ratio (i.e. W1/(W1+W2)) of the width of the first adhesive layer 124 and the maximum width of the pellicle frame 126 may range from about 25% to about 75%. In other words, the ratio of W1 and W2 (i.e. W1/W2) may range from about ⅓ to about 3. In some embodiments, the maximum width (W1+W2) of the pellicle frame 126 may range from about 1 millimeter to about 10 millimeters and the width (W1) of the first adhesive layer 124 may range from about 0.25 millimeter to about 7.5 millimeters.

Referring to FIG. 5, the first adhesive layer 124 includes four adhesive portions 124a and the distribution of the adhesive portions 124a is corresponding to four linear portions of the pellicle frame 126. In addition, the width of the first adhesive layer 124 is substantially equal to the maximum width of the pellicle frame 126 and the first adhesive layer 124 (i.e. the adhesive portion 124a) is thinner than the pellicle frame 126.

Referring to FIG. 6, the first adhesive layer 124 includes four adhesive portions 124a and the distribution of the adhesive portions 124a is corresponding to four linear portions of the pellicle frame 126. In addition, the width of the first adhesive layer 124 is less than the maximum width of the pellicle frame 126 and the first adhesive layer 124 (i.e. the adhesive portion 124a) is thinner than the pellicle frame 126.

As shown in FIG. 6, the width of the first adhesive layer 124 is W1 and the maximum width of the pellicle frame 126 is (W1+W2), and the ratio (i.e. W1/(W1+W2)) of the width of the first adhesive layer 124 and the maximum width of the pellicle frame 126 may range from about 25% to about 75%. In other words, the ratio of W1 and W2 (i.e. W1/W2) may range from about ⅓ to about 3. In some embodiments, the maximum width (W1+W2) of the pellicle frame 126 may range from about 1 millimeter to about 10 millimeters and the width (W1) of the first adhesive layer 124 may range from about 0.25 millimeter to about 7.5 millimeters.

In accordance with some embodiments of the present disclosure, a photo mask assembly including a photo mask, a first adhesive layer adhered with the photo mask, a pellicle frame and a pellicle is provided. The pellicle frame includes a plurality of recesses for accommodating the first adhesive layer. The pellicle frame is adhered with the photo mask through the first adhesive layer accommodated in the plurality of recesses. The pellicle is disposed on the pellicle frame. The pellicle frame is between the pellicle and the first adhesive layer.

In accordance with alternative embodiments of the present disclosure, a photo mask assembly including a photo mask, a first adhesive layer, a pellicle frame and a pellicle is provided. The photo mask includes a mounting surface and a light-shielding pattern distributed on the mounting surface. The first adhesive layer includes a plurality of adhesive portions adhered with the mounting surface of the photo mask. The pellicle frame includes a first surface in contact with the mounting surface of the photo mask, a second surface opposite to the first surface and a plurality of recesses extending from the first surface toward the second surface. The adhesive portions are accommodated in the plurality of recesses. The pellicle frame is adhered with the mounting surface of the photo mask through the adhesive portions in the plurality of recesses. The pellicle is adhered with the second surface of the pellicle frame.

In accordance with yet alternative embodiments of the present disclosure, an optical apparatus for performing a photolithography process on a substrate is provided. The optical apparatus includes a light source, a photo mask assembly disposed between the light source and the substrate and a projection lens disposed between the photo mask assembly and the substrate. The photo mask assembly includes a photo mask, an adhesive layer adhered with the photo mask, a pellicle frame and a pellicle disposed on the pellicle frame. The pellicle frame includes a plurality of recesses for accommodating the adhesive layer. The pellicle frame is adhered with the photo mask through the adhesive layer accommodated in the plurality of recesses. The pellicle frame is between the pellicle and the adhesive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photo mask assembly, comprising:
    a photo mask;
    a first adhesive layer adhered with the photo mask;
    a pellicle frame comprising a plurality of recesses for accommodating the first adhesive layer, the pellicle frame being adhered with the photo mask through the first adhesive layer accommodated in the plurality of recesses; and
    a pellicle disposed on the pellicle frame, the pellicle frame being between the pellicle and the first adhesive layer.

2. The photo mask assembly of claim 1, wherein the photo mask comprises a transparent substrate and a light-shielding pattern disposed on the transparent substrate, and the light-shielding pattern is between the transparent substrate and the pellicle.

3. The photo mask assembly of claim 1, wherein the first adhesive layer comprises a plurality of adhesive portions and each of the adhesive portions is accommodated in one of the plurality of recesses respectively.

4. The photo mask assembly of claim 1, wherein a width of the first adhesive layer is substantially equal to a maximum width of the pellicle frame and the first adhesive layer is thinner than the pellicle frame.

5. The photo mask assembly of claim 1, wherein a width of the first adhesive layer is less than a maximum width of the pellicle frame and the first adhesive layer is thinner than the pellicle frame.

6. The photo mask assembly of claim 1, wherein a maximum width of the pellicle frame ranges from 1 millimeter to 10 millimeters, a maximum thickness of the pellicle frame ranges from 1 millimeter to 10 millimeters and a thickness of the first adhesive layer ranges from 0.001 millimeter to 5 millimeters.

7. The photo mask assembly of claim 1, wherein a ratio of a width of the first adhesive layer and a maximum width of the pellicle frame ranges from 25% to 75%.

8. The photo mask assembly of claim 1, wherein a first contact area between the pellicle frame and the photo mask is A1, a second contact area between the first adhesive layer and the photo mask is A2, and a ratio of A1 and A2 ranges from 0.5 to 2.

9. The photo mask assembly of claim 1 further comprising a filter embedded in the pellicle frame.

10. The photo mask assembly of claim 1 further comprising a second adhesive layer between the pellicle and the pellicle frame.

11. A photo mask assembly, comprising:
    a photo mask comprising a mounting surface and a light-shielding pattern distributed on the mounting surface;
    a first adhesive layer comprising a plurality of adhesive portions adhered with the mounting surface of the photo mask;
    a pellicle frame comprising a first surface in contact with the mounting surface of the photo mask, a second surface opposite to the first surface and a plurality of recesses extending from the first surface toward the second surface, the adhesive portions being accommodated in the plurality of recesses, and the pellicle frame being adhered with the mounting surface of the photo mask through the adhesive portions in the plurality of recesses; and
    a pellicle adhered with the second surface of the pellicle frame.

12. The photo mask assembly of claim 11, wherein the photo mask further comprises a transparent substrate, the light-shielding pattern is disposed on the mounting surface of the transparent substrate and the light-shielding pattern is between the transparent substrate and the pellicle.

13. The photo mask assembly of claim 11, wherein a width of the adhesive portions is substantially equal to a maximum width of the pellicle frame and the adhesive portions are thinner than the pellicle frame.

14. The photo mask assembly of claim 11, wherein a width of the adhesive portions is less than a maximum width of the pellicle frame and the adhesive portions are thinner than the pellicle frame.

15. The photo mask assembly of claim 11, wherein a maximum width of the pellicle frame ranges from 1 millimeter to 10 millimeters, a maximum thickness of the pellicle frame ranges from 1 millimeter to 10 millimeters and a thickness of the first adhesive layer ranges from 0.001 millimeter to 5 millimeters.

16. The photo mask assembly of claim 11, wherein a ratio of a width of the adhesive portions and a maximum width of the pellicle frame ranges from 25% to 75%.

17. The photo mask assembly of claim 11, wherein a first contact area between the pellicle frame and the photo mask is A1, the second contact area between the adhesive portions and the photo mask is A2, and a ratio of A1 and A2 ranges from 0.5 to 2.

18. The photo mask assembly of claim 11 further comprising a filter embedded in the pellicle frame.

19. The photo mask assembly of claim 11 further comprising a second adhesive layer between the pellicle and the pellicle frame.

20. An optical apparatus for performing a photolithography process on a substrate, the optical apparatus comprising:

a light source;

a photo mask assembly disposed between the light source and the substrate, the photo mask assembly comprising a photo mask, an adhesive layer adhered with the photo mask, a pellicle frame and a pellicle disposed on the pellicle frame, the pellicle frame comprising a plurality of recesses for accommodating the adhesive layer, the pellicle frame being adhered with the photo mask through the adhesive layer accommodated in the plurality of recesses and the pellicle frame being between the pellicle and the adhesive layer; and a projection lens disposed between the photo mask assembly and the substrate.

\* \* \* \* \*